United States Patent
Singh et al.

(10) Patent No.: US 6,724,462 B1
(45) Date of Patent: Apr. 20, 2004

(54) CAPPING LAYER FOR EUV OPTICAL ELEMENTS

(75) Inventors: Mandeep Singh, Twickenham (GB); Hugo M. Visser, Utrecht (NL)

(73) Assignee: ASML Netherlands B.V., Veldhoven (NL)

( * ) Notice: Subject to any disclaimer, the term of this patent is extended or adjusted under 35 U.S.C. 154(b) by 195 days.

(21) Appl. No.: 09/605,657

(22) Filed: Jun. 28, 2000

(30) Foreign Application Priority Data

| Jul. 2, 1999 | (EP) | ............................................. 99305283 |
| Oct. 7, 1999 | (EP) | ............................................. 99307932 |

(51) Int. Cl.[7] .................. G03B 27/42; G03B 27/52; G03B 27/54
(52) U.S. Cl. .............................. 355/53; 355/30; 355/67
(58) Field of Search ........................ 355/53, 30, 67–71; 359/350, 509, 512; 428/627; 378/82, 84; 250/548

(56) References Cited

U.S. PATENT DOCUMENTS

| 5,265,143 | A | * | 11/1993 | Early et al. ..................... 378/84 |
| 5,356,662 | A | * | 10/1994 | Early et al. ................... 427/140 |
| 5,433,988 | A | | 7/1995 | Fukuda et al. |
| 5,646,976 | A | * | 7/1997 | Gutman ......................... 378/84 |
| 5,850,309 | A | | 12/1998 | Shirai et al. |
| 5,911,858 | A | | 6/1999 | Ruffner |
| 5,958,605 | A | * | 9/1999 | Montcalm et al. ........... 428/627 |
| 5,981,075 | A | * | 11/1999 | Ohmi et al. ................. 428/428 |
| 6,100,515 | A | * | 8/2000 | Nishi et al. .................. 250/205 |
| 6,268,904 | B1 | * | 7/2001 | Mori et al. .................... 355/53 |
| 6,395,433 | B1 | * | 5/2002 | Smith ............................. 430/5 |
| 6,414,743 | B1 | * | 7/2002 | Nishi et al. .................... 355/69 |

FOREIGN PATENT DOCUMENTS

| EP | 0 708 367 A1 | 4/1996 |
| EP | 0 905 565 A1 | 3/1999 |
| EP | 0 922 996 A1 | 6/1999 |
| WO | WO 98/28665 | 7/1998 |
| WO | WO 99/24851 | 5/1999 |

OTHER PUBLICATIONS

Hudek et al., "E–beam and RIE examination of chemically amplified positive–tone resist CAMP6," *Microelectronic Engineering* 26:167–179 (1995), XP004000099.

Skulina et al., "Molybdenum/beryllium multilayer mirrors for normal incidence in the extreme ultraviolet," *Applied Optics* 34(19):3727–3730 (1995), XP000537295.

Mirkarimi et al., "Advances in the reduction and compensation of film stress in high–reflectance multilayer coatings for extreme ultraviolet lithography," *Proceedings of the SPIE* 3331:133–148 (1998), XP00900531.

* cited by examiner

*Primary Examiner*—Henry Hung Nguyen
(74) *Attorney, Agent, or Firm*—Pillsbury Winthrop LLP

(57) ABSTRACT

Optical elements such as multilayered EUV mirrors are provided with protective capping layers of diamond-like carbon (C), boron nitride (BN), boron carbide ($B_4C$), silicon nitride ($Si_3N_4$), silicon carbide (SiC), B, Pd, Ru, Rh, Au, $MgF_2$, LiF, $C_2F_4$ and TiN and compounds and alloys thereof. The final period of a multilayer coating may also be modified to provide improved protective characteristics.

38 Claims, 7 Drawing Sheets

CAPPING LAYER FOR EUV OPTICAL ELEMENTS

BACKGROUND OF THE INVENTION

Field of the Invention

The present invention relates to capping layers for optical elements, e.g. multilayer mirrors, for use with extreme ultraviolet (EUV) radiation. More particularly, the invention relates to the use of capping layers on optical elements in lithographic projection apparatus comprising:

an illumination system for supplying a projection beam of radiation;

a first object table provided with a mask holder for holding a mask;

a second object table provided with a substrate holder for holding a substrate; and a projection system for imaging an irradiated portion of the mask onto a target portion of the substrate.

For the sake of simplicity, the projection system may hereinafter be referred to as the "lens"; however, this term should be broadly interpreted as encompassing various types of projection system, including refractive optics, reflective optics, catadioptric systems, and charged particle optics, for example. The illumination system may also include elements operating according to any of these principles for directing, shaping or controlling the projection beam, and such elements may also be referred to below, collectively or singularly, as a "lens". In addition, the first and second object tables may be referred to as the "mask-table" and the "substrate table", respectively.

In the present document, the invention is described using a reference system of orthogonal X, Y and Z directions and rotation about an axis parallel to the I direction is denoted Ri. Further, unless the context otherwise requires, the term "vertical" (Z) used herein is intended to refer to the direction normal to the substrate or mask surface or parallel to the optical axis of an optical system, rather than implying any particular orientation of the apparatus. Similarly, the term "horizontal" refers to a direction parallel to the substrate or mask surface or perpendicular to the optical axis, and thus normal to the "vertical" direction.

Lithographic projection apparatus can be used, for example, in the manufacture of integrated circuits (ICs). In such a case, the mask (reticle) may contain a circuit pattern corresponding to an individual layer of the IC, and this pattern can be imaged onto an exposure area (die) on a substrate (silicon wafer) which has been coated with a layer of photosensitive material (resist). In general, a single wafer will contain a whole network of adjacent dies which are successively irradiated via the reticle, one at a time. In one type of lithographic projection apparatus, each die is irradiated by exposing the entire a reticle pattern onto the die at ones; such an apparatus is commonly referred to as a wafer stepper. In an alternative apparatus—which is commonly referred to as a step-and-scan apparatus—each die is irradiated by progressively scanning the reticle pattern under the projection beam in a given reference direction (the "scanning" direction) while synchronously scanning the wafer table parallel or anti-parallel to this direction; since, in general, the projection system will have a magnification factor M generally <1), the speed V at which the wafer table is scanned will be a factor M times that at which the reticle table is scanned. More information with regard to lithographic devices as here described can be gleaned from International Patent Application WO97/33205, for example.

Until very recently, lithographic apparatus contained a single mask table and a single substrate table. However, machines are now becoming available in which there are at least two independently moveable substrate tables; see, for example, the multi-stage apparatus described in International Patent Applications WO98/28665 and WO98/40791. The basic operating principle behind such multi-stage apparatus is that, while a first substrate table is at the exposure position underneath the projection system for exposure of a first substrate located on that table, a second substrate table can run to a loading position, discharge a previously exposed substrate, pick up a new substrate, perform some initial measurements on the new substrate and then stand ready to transfer the new substrate to the exposure position underneath the projection system as soon as exposure of the first substrate is completed; the cycle then repeats. In this manner it is possible to increase substantially the machine throughput, which in turn improves the cost of ownership of the machine. It should be understood that the same principle could be used with just one substrate table which is moved between exposure and measurement positions.

In a lithographic apparatus the size of features that can be imaged onto the wafer is limited by the wavelength of the projection radiation. To produce integrated circuits with a higher density of devices, and hence higher operating speeds, it is desirable to be able to image smaller features. While most current lithographic projection apparatus employ ultraviolet light generated by mercury lamps or excimer lasers, it has been proposed to use shorter wavelength radiation of around 13 nm. Such radiation is termed extreme ultraviolet (EUV) or soft x-ray and possible sources include laser plasma sources or synchrotron radiation from electron storage rings. An outline design of a lithographic projection apparatus using synchrotron radiation is described in "Synchrotron radiation sources and condensers for projection x-ray lithography", J B Murphy et al, Applied Optics Vol. 32 No. 24 pp 6920–6929 (1993).

Optical elements for use in the EUV spectral region, e.g. multilayered thin film reflectors, are especialy sensitive to physical and chemical damage which can significantly reduce their reflectivity and optical quality. Reflectivities at these wavelengths are already low compared to reflectors at longer wavelengths which is a particular problem since a typical EUV lithographic system may have nine mirrors; two in the illumination optics, six in the imaging optics plus the reflecting reticle. It is therefore evident that even a "small" decrease of 1–2% in the peak reflectivity of a single mirror will cause a significant light throughput reduction in the optical system.

A further problem is that some sources of EUV radiation, e.g. plasma based sources, are "dirty" in that they also emit significant quantities of fast ions and other particles which can damage otical elements in the illumination system.

Proposals to reduce these problems have involved maintaining the optical systems at very high vacuum, with particularly stringent requirements on the partial pressures of hydrocarbons which may be adsorbed onto the optical elements and then cracked by the EUV radiation to leave opaque carbon films.

SUMMARY OF THE INVENTION

It is an object of the present invention to provide optical elements, including multilayer mirrors, for use in lithographic projection apparatus using extreme ultraviolet radiation (EUV) for the projection beam, that are more resistant to chemical and physical attack.

According to the present invention, this and other objects are achieved in a lithographic projection apparatus comprising:

an illumination system for supplying a projection beam of radiation;

a first object table provided with a mask holder for holding a mask;

a second object table provided with a substrate holder for holding a substrate; and a projection system for imaging an irradiated portion of the mask onto a target portion of the substrate; characterised by:

at least one optical element having a surface on which radiation of the same wavelength as the wavelength of said projection beam is incident and a capping layer covering said surface, said capping layer being formed of a relatively inert material.

The optical element may be a beam modifying element such as a reflector, e.g. a multilayer near-normal incidence mirror or a grazing incidence mirror, included in one of the illumination and projection systems: an integrator, such as a scattering plate: the mask itself, especially if a multilayer mask; or any other optical element involved in directing, focussing, shaping, controlling, etc. the projection beam. The optical element may also be a sensor such as an image sensor or a spot sensor;

The relatively inert material in particular should be resistant to oxidation and may be selected from the group comprising: diamond-like carbon (C), boron nitride (BN), boron carbide ($B_4C$), silicon nitride ($Si_3N_4$), silicon carbide (SiC), B, Pd, Ru, Rh, Au, $MgF_2$, LiF, $C_2F_4$ and TiN and compounds and alloys thereof.

The capping layer should have a sufficient thickness to protect the underlying optical element from attack, so that the capping layer is effecively "chemically opaque", yet not be too thick so as to absorb too much of the incident radiation. To these ends, the capping layer may have a thickness in the range of from 0.5 to 10 nm, preferably from 0.5 to 6 nm and most preferably from 0.5 to 3 nm.

The capping layer may itself have a multi-layer structure, e.g. of two layers, with the outermost layer chosen both for improved chemical resistance and low refractive index at the wavelength of the projection beam to improve reflectivity or transmissivity.

A second aspect of the invention provides a device manufacturing method using a lithographic apparatus comprising an illumination system for supplying a projection beam of radiation;

a first object table provided with a first object holder for holding a mask;

a second object table provided with a second object holder for holding a substrate; and a projection system for imaging an irradiated portion of the mask onto a target portion of the substrate; said method comprising the steps of:

providing a mask containing a pattern to said first object table;

providing a substrate at least partially covered by a layer of energy-sensitive material to said second object table;

irradiating said mask and imaging irradiated portions of said pattern onto said substrate; characterised in that:
said lithographic projection apparatus comprises at least one optical element having a surface on which radiation of the same wavelength as the wavelength of said projection beam is incident and a capping layer covering said surface, said capping layer being formed of a relatively inert material.

In a manufacturing process using a lithographic projection apparatus according to the invention a pattern in a mask is imaged onto a substrate which is at least partially covered by a layer of energy-sensitive material (resist). Prior to this imaging step, the substrate may undergo various procedures, such as priming, resist coating and a soft bake. After exposure, the substrate may be subjected to other procedures, such as a post-exposure bake WEB), development, a hard bake and measurement/inspection of the imaged features. This array of procedures is used as a basis to pattern an individual layer of a device, e.g. an IC. Such a patterned layer may then undergo various processes such as etching, ion-implantation (doping) metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-0672504.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target area", respectively.

BRIEF DESCRIPTION OF THE DRAWINGS

The present invention and its attendant advantages will be described below with reference to exemplary embodiments and the accompanying schematic drawings, in which.

In the various drawings, like parts are indicated by like references.

DETAILED DESCRIPTION OF THE EMBODIMENTS

Embodiment 1

Figure 1:
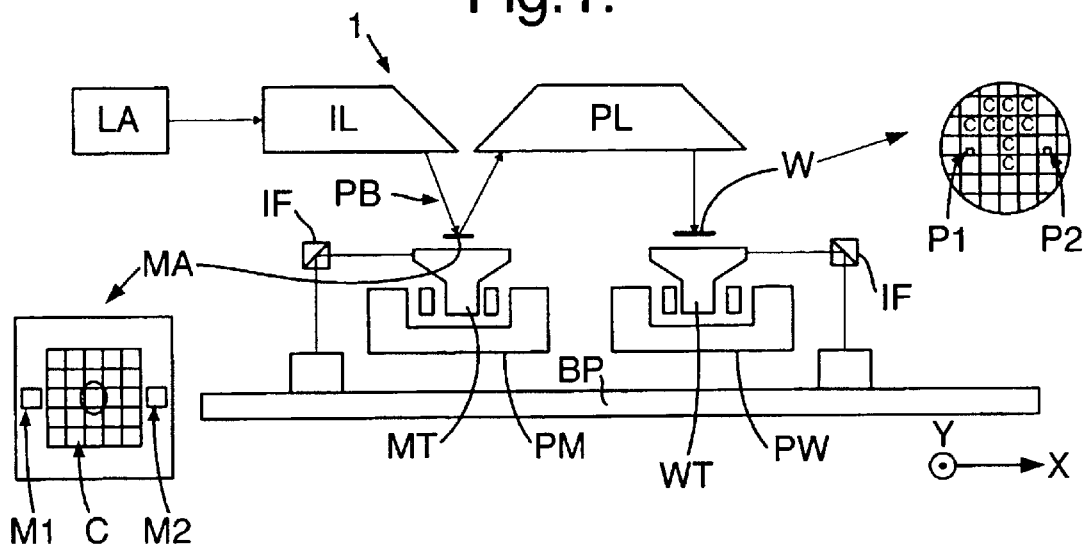
FIG. 1 depicts a lithographic projection apparatus according to the invention.

FIG. 1 schematically depicts a lithographic projection apparatus according to the invention. The apparatus comprises:

- a radiation system LA, IL for supplying a projection beam PB of EUV radiation;
- a first object table (mask table) MT provided with a mask holder for holding a mask MA (e.g. a reticle), and connected to first positioning means PM for accurately positioning the mask with respect to item PL;
- a second object table (substrate table) WT provided with a substrate holder for holding a substrate W (e.g. a resist-coated silicon wafer), and connected to second positioning means PW for accurately positioning the substrate with respect to item PL;
- a projection system ("lens") PL (e.g. a refractive or catadioptric system or a reflective system) for imaging an irradiated portion of the mask MA onto a target portion C (die) of the substrate W.

The radiation system comprises a source LA (e.g. an undulator or wiggler provided around the path of an electron beam in a storage ring or synchrotron or a laser-induced plasma source) which produces a beam of radiation. This beam is passed along various optical components included in illumination system ("lens") IL so that the resultant beam PB is collected in such a way as to give uniform illumination at the entrance pupil and the mask.

The beam PB subsequently impinges upon the mask MA which is held in a mask holder on a mask table MT. Having been selectively reflected by the mask MA, the beam PB passes through the lens PL, which focuses the beam PB onto a target area C of the substrate W. With the aid of first positioning means PW and the interferometric displacement measuring means IF, the substrate table WT can be moved accurately, e.g. so as to position different target areas C in the path of the beam PB. Similarly, the positioning means PM can be used to accurately position the mask MA with respect to the path of the beam PB, e.g. after mechanical retrieval of the mask MA from a mask library. The references M1, M2 correspond to reticle alignment marks and the references P1 and P2 correspond to wafer alignment marks. In general, movement of the object tables MT, WT will be realized with the aid of a long stroke module (coarse positioning) and a short stroke module (fine positioning), which are not explicitly depicted in FIG. 1.

The depicted apparatus can be used in two different modes:

In step mode, the mask table MT is kept essentially stationary, and an entire mask image is projected at ones (i.e. a single "flash") onto a target area C. The substrate table WT is then shifted in the x and/or y directions so that a different target area C can be irradiated by the beam PB;

In scan mode, essentially the same scenario applies, except that a given target area C is not exposed in a single "flash". Instead, the mask table MT is movable in a given direction (the so-called "scan direction", e.g. the x direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target area C can be exposed, without having to compromise on resolution.

The illumination system IL may be constructed as described in copending European Patent Application 00300784.6 (applicant's ref P-0129), which is hereby incorporated by reference.

EXAMPLES

The examples of the invention described below are obtained from computations performed using the thin film design program TFCalc (Software Spectra Inc.) and verified using LPro (4D Technology Ltd.). The built-in global and needle optimisation routines of TFCalc were used for the optimisation process, as described in A. V. Tikhonravov, Appl. Opt. 32, 5417 (1993), A. V. Tikhonravov, M. K. Trubetskov and G M. DeBell, Appl. Opt. 35, 5493 (1996) and J. A. Dobrowski and R. A. Kemp, Appl. Opt. 29, 2876 (1990), which references are incorporated herein by reference. The optical constants of the various materials, namely the complex refractive index N=n−ik are derived from atomic scattering factors by Henke et. al. and were obtained from the CXRO web server at Berkeley (B. L. Henke, E. M. Gullikson, and J. C. Davis, Atomic Data and Nuclear Data Tables, 54(2), 181–342 (1993); http://www.cxro.lbl.gov/optical_constants/). The values of n and k for the materials used were downloaded as functions of wavelength from 6 nm to 42 nm and as such the wavelength dependence of n and k is implicit in all calculations. The values of n and k for various materials at some wavelengths of particular interest are tabulated in Table 1 below. To demonstrate the performance enhancement of the reflectors according to the invention, we assume ideal "white" light illumination in the examples below.

COMPARATIVE EXAMPLE 1

Comparative Example 1 is a standard Si-based multilayer stack comprising an unoptimised 50-period Mo/Si system grown on a Zerodur (RTM) glass substrate, with a partition ratio Γ=0.4, yielding $d_{Mo}$=2.8 nm and $d_{Si}$=4.1 nm. In addition, it is assumed that the final Si layer will undergo oxidation and effectively form a ~2 nm layer of native oxide. Analysis of such a stack yields a peak reflectivity at ~13.4 nm of R=0.731. This stack provides the reference for performance comparisons of stacks according to the invention.

EXAMPLES 2 to 23

Examples 2 to 23 according to the invention consist of variations on the stack of reference example 1 as detailed in Table 2 below. In Table 2, column 2 gives the materials used in the layers of the stack; column 3 gives the optimization applied: N indicates none, Y indicates global optimization and Y(n) indicates needle optimization (described further below); column 4 gives the capping layer applied; column 5 gives the peak reflectivity R; column 6 gives the R$^9$peak reflectivity in relative units and column 7 gives the R$^9$int (integrated) reflectivity in relative units.

For a 9-reflector system, a more useful measure of optical throughput is the value of R$^9$, which the net reflectivity of a series of nine reflectors. $R^9$int is the area under the curve in the $R^9$ vs. λ (wavelength) spectrum. The variation between $R^9$peak and $R^9$int for a given stack is an indication of the variation in the spectral half-width which is a function of the optimization process, or the incorporated materials, or the capping layer material, or any combination of the three.

The final surface layer of all of examples 2 to 20 is a 4.1–4.5 nm Si layer on which the capping layer specified in column 4 is deposited, or grown in the case of SiO. Growing the $SiO_2$ consumes the surface Si layer so that in the case of Example 2 the top two layers are 2 nm of Si, the remains of the approximately 4 nm Si layer prior to oxidation and which may be regarded as the final layer of the multilayer, and 2 nm $SiO_2$. Examples 21 to 23 are terminated with a 4.0 to 4.4 nm Rb layer upon which the capping layer specified in column 4 is deposited.

Example 2 is an unoptimized Mo/Si stack in which a 2 nm native oxide is allowed to grow on a 6 nm Si top layer (compared to the 4 nm top layer of comparative example 1), resulting in a 1% increase in R, a 13% increase in $R^9$peak and a 7% increase in $R^9$int.

In example 3, a 25% gain in $R^9$int is achieved by deposition of a 2 nm B capping layer. Further increases in examples 4 to 7 follow by selecting Rh or Ru as capping layers and optimising the stack. A gain of up to 36% for a two-component (Mo/Si) multilayer stack can be achieved by optimization, as shown by example 7.

Figure 2:
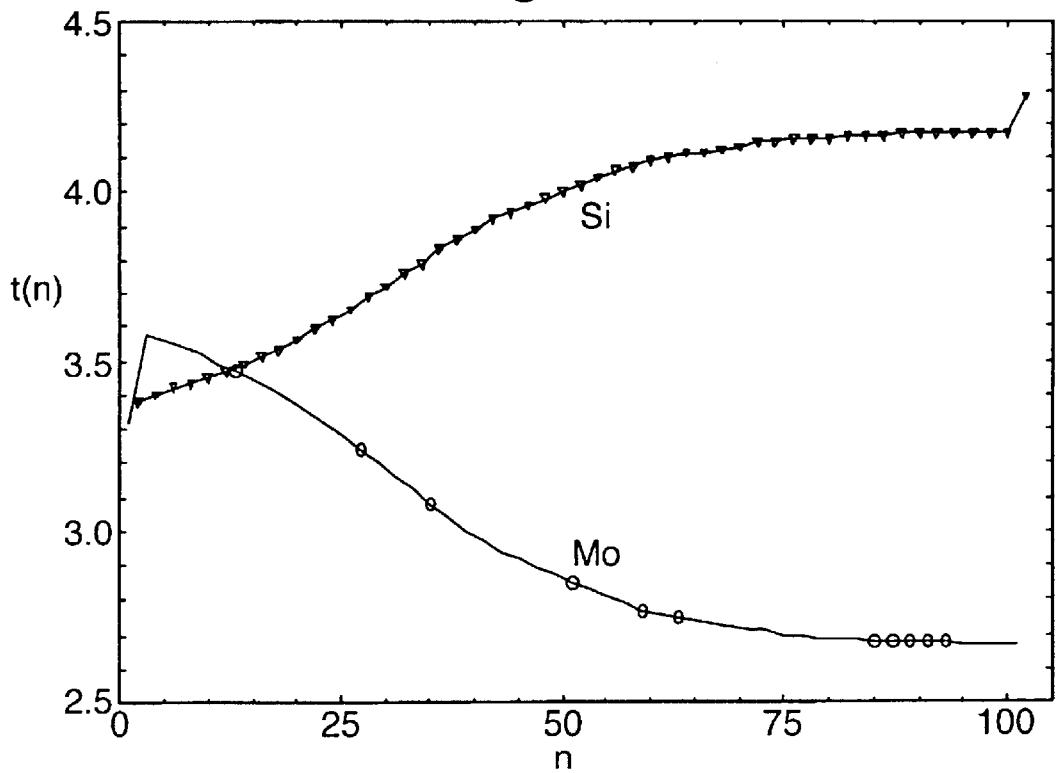
FIG. 2 is a graph of layer thicknesses in a 51 period optimised Mo/Si stack according to the invention.

FIG. 2 shows the layer structure of a 51 period (102 layer) optimized Mo/Si stack with a 1.5 nm capping layer. In the Figure, layer 0 is the substrate surface. As can be seen, the optimisation of the Mo/Si stack results in a gradual, smooth variation of the layer thicknesses through the stack while the period width remains nominally constant at about 6.8 to 7.0 nm. Near the substrate, $d_{Mo}≈d_{Si}≈3.5$ nm varying to $d_{Mo}=2.7$ nm and $d_{Si}≈4.2$nm near the surface. In the stack illustrated in FIG. 2 the partition ratio Γ remains at about 0.4 for the first 20 periods from the surface (one period=one pair of layers, i.e. one Mo layer and one Si layer) and thereafter gradually changes to about 0.5 at the substrate. Thus it appears that the higher the absorption in the material, the lower the thickness near the surface, for an optimum reflectivity response. This phenomenon is discussed further below.

Figure 3:
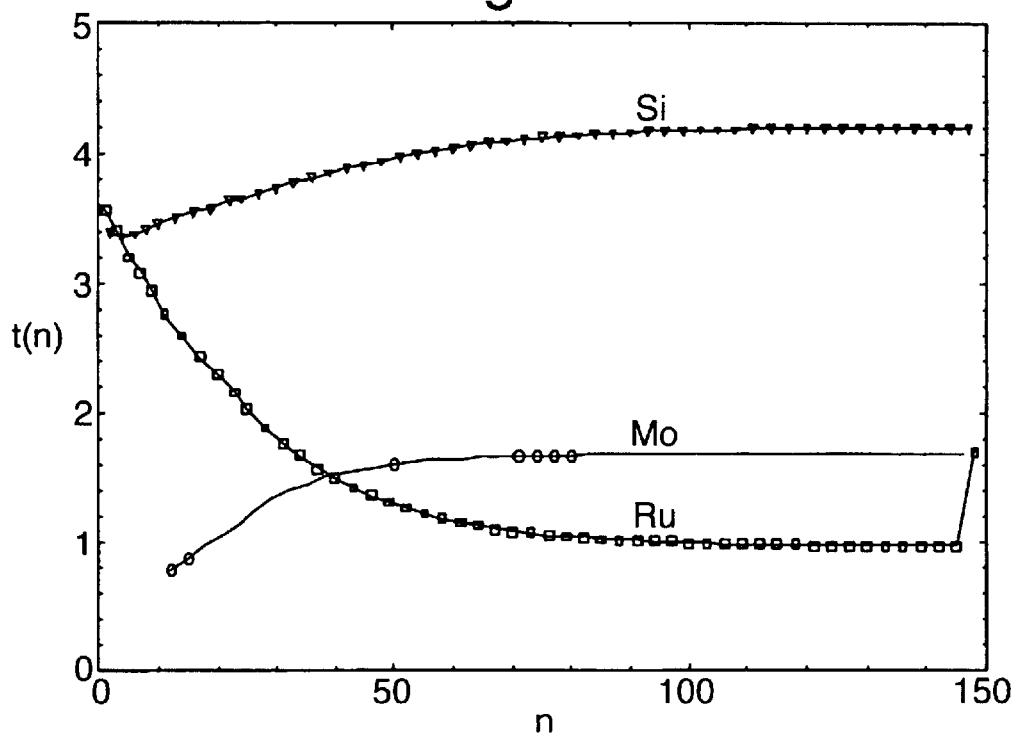
FIG. 3 is a graph of layer thicknesses in a 50 period Mo—Ru/Si stack according to the invention.

The three component system of examples 8 to 12 is set up initially as a two-component Mo/Si stack with the third material interleaved between the Mo and Si layers with its initial thickness set to zero. The global optimization process then varies the thicknesses of all the layers until a pre-set reflectivity target is approached. In the case of Mo—Rh/Si and Mo—Ru/Si, Mo is favored near the surface and Rh or Ru near the substrate whereas, in the Mo—RbCl/Si system, RbCl (which is a single entity) partially substitutes for Si in the centre of the stack, i.e. the sum of the thicknesses of the adjacent RbCl and Si layers approaches the thickness of Si in a standard stack. The layer structure for the Mo—Ru/Si stack is shown in FIG. 3. This stack has 50 Si layers, including the uppermost layer, and therefore has 148 layers in total, plus a 1.5 nm Ru capping layer. In the figure, layer 0 is the substrate surface. A 50% gain in computed throughput is observed for the Mo—Ru/Si system over the standard Mo/Si stack.

Figure 4:
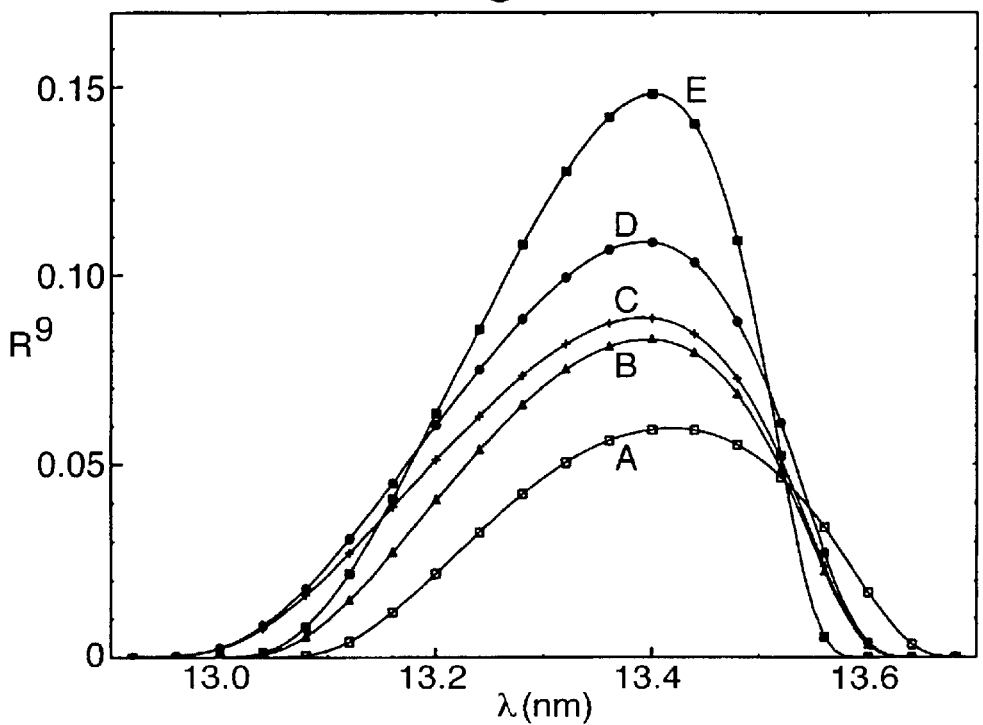
FIG. 4 is a graph of $R^9$ vs. wavelength in the 13.4 nm region for various mirrors embodying the invention and a conventional mirror for comparison.

Example 12 shows a further improvement in $R^9$int for the Mo—Ru/Si system using needle optimization. In the needle optimization routine, additional layers of designated materials, in this case, Mo, Ru and Rh, with vanishingly small thicknesses, are periodically added to the stack. These layers are then allowed to grow or be rejected by a local optimization process. The needle-optimized stack therefore also contains Rh and additional layers of Mo, the net result of which is a 59% increase in $R^9$int compared to the standard stack. It is also worth noting that in this case $R^9$int>$R^9$peak with the peak reflectivity of 0.764 only marginally lower than for the standard optimized Mo—Ru/Si stack. This indicates that a substantially greater spectral half-width results from the needle optimization process as can be seen in FIG. 4, which is a graph showing $R^9$ vs. wavelength in the 13.4 nm region. Line A is for the standard Mo/Si stack, reference example 1; B is optimized Mo/Si, example 4; C is Mo—Ru/Si needle optimized, example 12; D is Mo—Ru—Sr/Si needle optimized, example 19, and E is Mo/Rb optimized, example 22.

Figure 5:
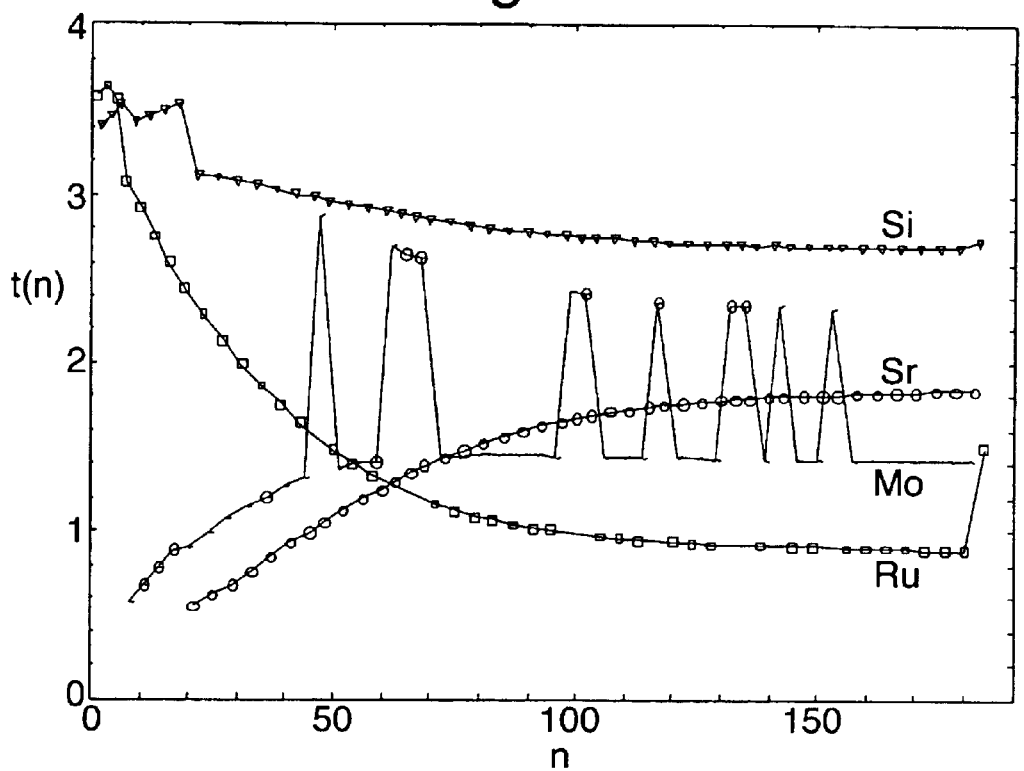
FIG. 5 is a graph of layer thicknesses in a 50 period Mo—Ru—Sr/Si stack according to the invention.

The order of layers in the three component stacks may be varied. For example, Rh—Mo/Si may be used instead of Mo—Rh/Si and Ru—Mo/Si instead of Mo—Ru/Si The four-component stacks, examples 13 to 20, were built in a similar manner to the three component stacks described above. The most favourable combination is Mo—Ru—Sr/Si with up to an 88% relative increase in output intensity. FIG. 5 shows the layer thicknesses (nm) of a 50 period Mo—Ru—Sr/Si stack with a Ru capping layer. As before, layer 0 indicates the substrate surface. Again, within the first 50 layers from the substrate Ru predominates over Mo. The spikes in the Mo layer thickness profile indicate layers where the Ru layer has been wholly replaced by Mo as suggested by the numerical optimization technique. This is not essential to the gain in $R^9$int and the relevant Mo layers can be replaced by pairs of Mo and Ru layers. Sr performs a similar function to Si in the stack as it has a high value of n and a low extinction coefficient, k, (see Table 1). The low absorption within the Sr layers makes it preferable in the top half of the stack. As with the Mo—Ru/Si example discussed above, the sums of the thicknesses of Si and Sr and Ru and Mo approximate respectively to the optimised Si and Mo thicknesses shown in FIG. 2. The preferred order of the elements is: Ru—Mo—Sr—Si. The grouping of layers may also be varied, e.g. Ru—Mo—Sr/Si may be regarded as Ru—Mo/Sr—Si for calculation purposes.

Figure 6:
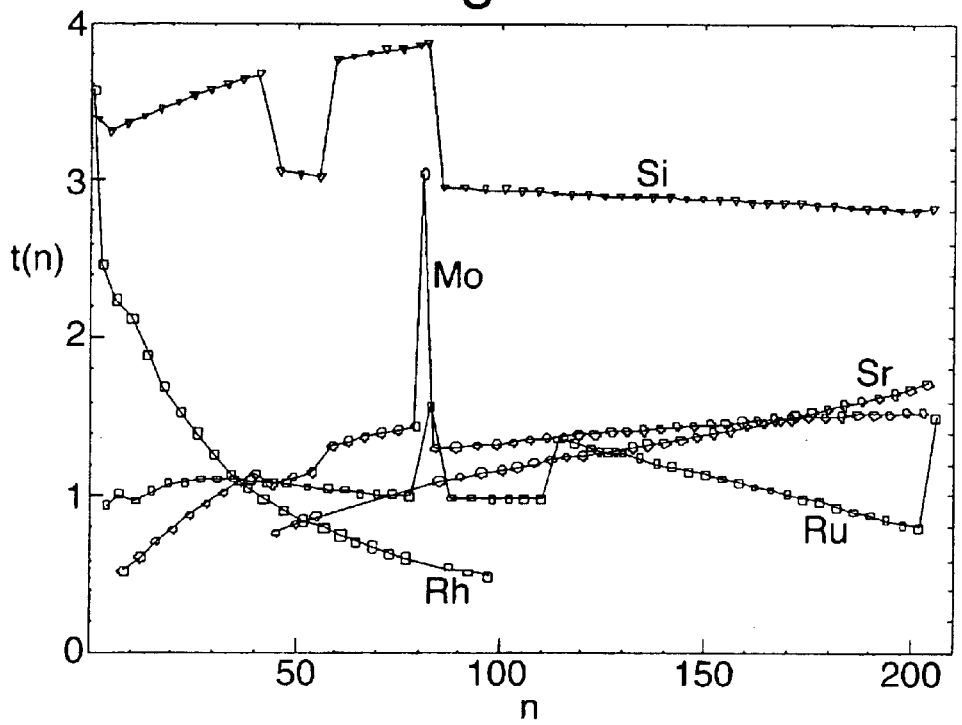
FIG. 6 is a graph of layer thicknesses in a needle optimised 50 period Mo—Ru—Sr/Si stack according to the invention.

FIG. 6 shows the layer thicknesses of a needle-optimized 50 period (50 Si layers) Mo—Ru—Sr/Si stack. Rh is included only in the lower half of the stack and predominantly in the first 40 layers. In the lowest layers Rh is preferred over Ru because of its higher optical contrast with Si, in spite of its higher extinction coefficient.

Sr and Y are less easily depositable owing to the complex chemistry of Y and the high reactivity of Sr, so are less preferred, but still show advantages over the conventional stack. Mo—Ru—Zr/Si and Mo—Ru—RbCl/Si show particular promise, as do the same layers in the order Ru—Mo—Zr/Si and Ru—Mo—RbCl/Si.

A comparison of the optical constants of Rb and Si (Table 1) indicates that Rb is in principle a more optimal material as a spacer layer. With a value of n at 13.4 nm similar to that of Si (close to unity), Rb would maintain the optical contrast with e.g. Mo and Ru. In addition, the lower value of the extinction coefficient k compared to that of Si, makes Rb a near optimal spacer material. This is borne out by examples 21 to 23 as can be seen from Table 2. An increase in the peak reflectivity of 5% is found for the Mo/Rb stack as compared to the equivalent Mo/Si stack yielding a value of $R^9$int which is more than a factor 2 higher than the standard Mo/Si stack. However, Rb-based systems present constructional and operational difficulties due to the high reactivity and extremely low melting point (39° C.) of Rb.

REFERENCE EXAMPLE 24

Reference example 24 is a multilayer stack for use at 11.3 nm comprising an unoptimised 80-period Mo/Be system grown on a Zerodur (RTM) glass substrate, with a partition ratio $\Gamma=0.4$ yielding $d_{Mo}=2.3$ nm and $d_{Be}=3.4$ nm. This provides the reference for examples 25 to 40 which are tuned for use at 11.3 nm.

EXAMPLES 25 to 40

Table 3 corresponds to Table 2 but gives data for examples 25 to 40 according to the invention which are reflector stacks tuned for use at 11.3 nm.

The effects of optimization and the capping layer deposition are less important at 11.3 nm than at 13.4 nm, only 8% improvement in $R^9$int is provided.

However, Ru and Rh are preferred to Mo for the 11.3 nm window. The Ru/Be stack has a relative optical throughput greater by up to 70% compared to the Mo/Be reference example, whilst the throughput of the Rh/Be stack is 33% greater. Although this is significantly lower than for Ru/Be, this combination may be preferable in some applications of the invention due to factors such as Rh—Be interface chemistry.

A particularly preferred embodiment of the invention is the "needle" optimized Rh/Be stack which exhibits a huge increase in reflectivity. This is due to the incorporation of Pd, Ru and Mo layers during the optimization process effectively transforming it into a Rh—Ru—Pd—Mo/Be or Pd—Rh—Ru—Mo/Be multi-component stack.

Figure 7:
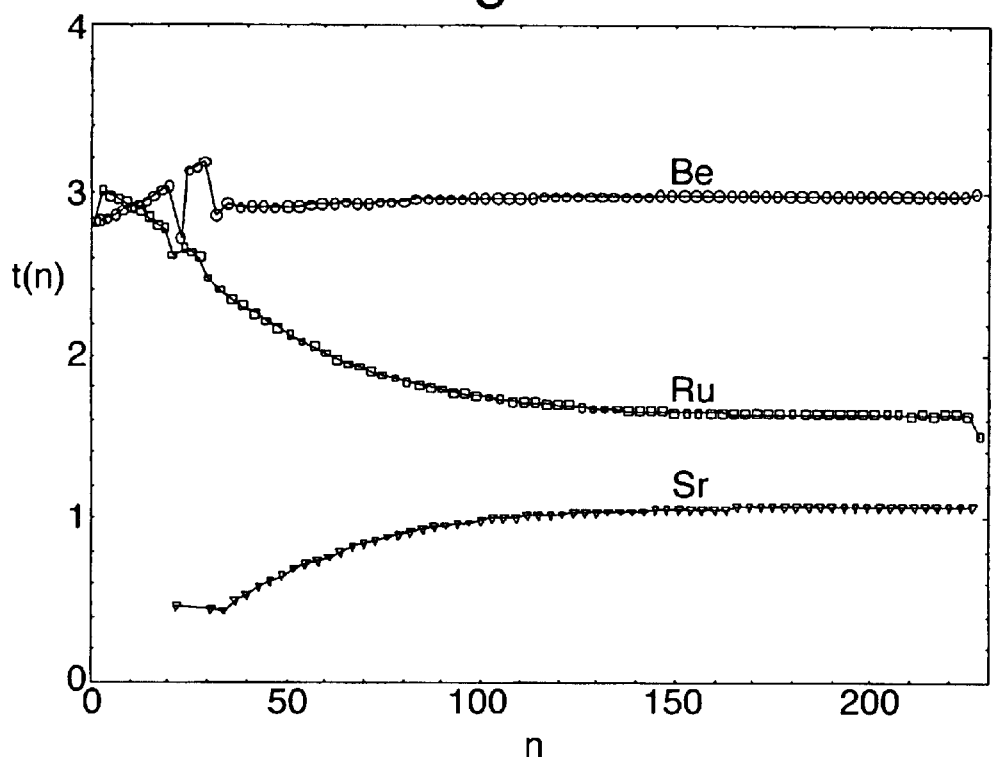
FIG. 7 is a graph of layer thicknesses in an 80 period Ru—Sr/Be stack according to the invention.

The layer thicknesses of an 80 period (80 Be layers) Ru—Sr/Be stack capped with a 1.5 nm Ru layer are shown in FIG. 7. Similar results may be achieved with Ru/Sr—Be. As before, the substrate surface is indicated at layer 0. Due to their similar optical constants, Be and Sr perform similar functions in the stack with Ru predominating near the substrate. The sum of the Be and Sr thicknesses near the surface is about 4.1 nm whilst the Ru thickness is about 1.7 nm. These are markedly different than the thicknesses of the Mo/Be stack with $\Gamma=0.4$. This is because of the higher extinction coefficient of Ru, as compared to Mo, such that a lower Ru thickness is preferred. The gain in employing Ru in place of Mo derives from the resultant increase in optical contrast with Be. The preferred stack period is: Ru—Sr—Be.

Figure 8:
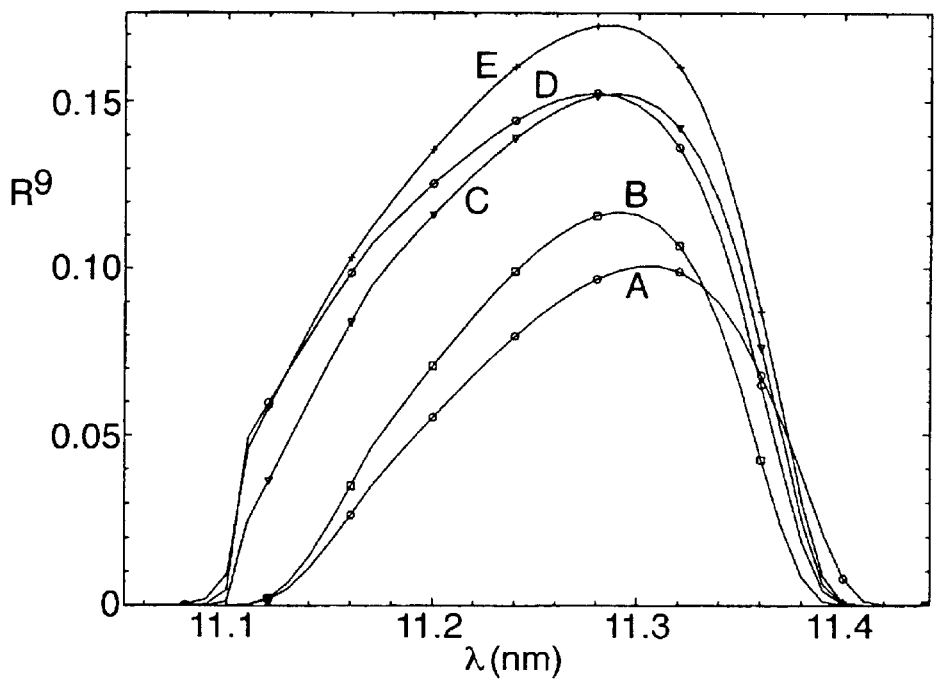
FIG. 8 is a graph of $R^9$ vs. wavelength in the 11.3 nm region for various mirrors embodying the invention and a conventional mirror for comparison.

Selected spectra of Be-based multilayers are shown in FIG. 8. This Figure shows plots of $R^9$ vs. wavelength in the 11.3 nm region for five stacks. A is the reference Mo/Be stack, B is an optimised Mo/Be stack with a Ru capping layer, C is an optimised Ru/Be stack, D is a needle optimised Rh/Be stack and E is an optimised, Ru-capped Ru—Sr/Be stack.

Examples 35 to 40 are strontium-containing three component systems which yield throughput enhancements of up to a factor of 2.

As capping layers, Rh and Ru are optimum for this wavelength region and give an increase of 0.7–1.0% in R.

EXAMPLES 41 to 44

From the above computational analysis of the various multilayer systems for the EUV region between 11 nm and 14 nm it would appear that significant enhancements in peak reflectivities and the integrated reflectivities for a 9-mirror optical system are possible. A combination of capping layer choice, global and needle optimisation routines and, most importantly, the incorporation of additional or replacement materials within the stack appears to be the recipe for reflectivity enhancement. Metals such as Rh and Ru which are generally easily deposited using various vacuum deposition techniques provide advantages, especially in conjunction with Be for the 11.3 nm region where they surpass Mo in theoretical performance. Furthermore, it is conceivable that using the various combinations discussed above, problems of interface roughness associated with Mo/Si(Be) may be alleviated somewhat.

In for instance the Mo—Rh/Si and Mo—Ru/Si stacks, improved results are provided with Rh(Ru) predominating over Mo near the substrate and vice-versa near the surface. This may be because at 13.4 nm Rh and Ru exhibit a higher optical contrast with Si than does Mo whereas the extinction coefficient k, and therefore the absorption within the layer, is lower for Mo than Rh and Ru. Near the surface of the stack, it is important that there be low absorption so that the incident radiation penetrates as deep into the stack as possible so that the phasor addition is maximized. However deep within the stack where the intensity is low, increased optical contrast is favored for the reflected intensity to be maximized.

When Sr is incorporated in the structure it is preferentially located in the near-surface region of the stack and partially substitutes Si. This can be explained by similar arguments, the value of n for Sr is lower than that of Si and therefore while the optical contrast with the low-n materials is slightly lowered, the lower value of k for Sr compared with Si (see Table 1) means that the absorption within the layer is lower thus favoring Sr near the surface of the stack. The data obtained for Be-based stacks for 11.3 nm operation indicates that similar effects occur.

Examples 41 to 44 are designed for use with a Xenon-jet laser-induced plasma source (Xe-Jet LPS) which has a peak output intensity at about 10.9 nm, somewhat lower than the range for which the reflectors described above were designed.

Figure 9:
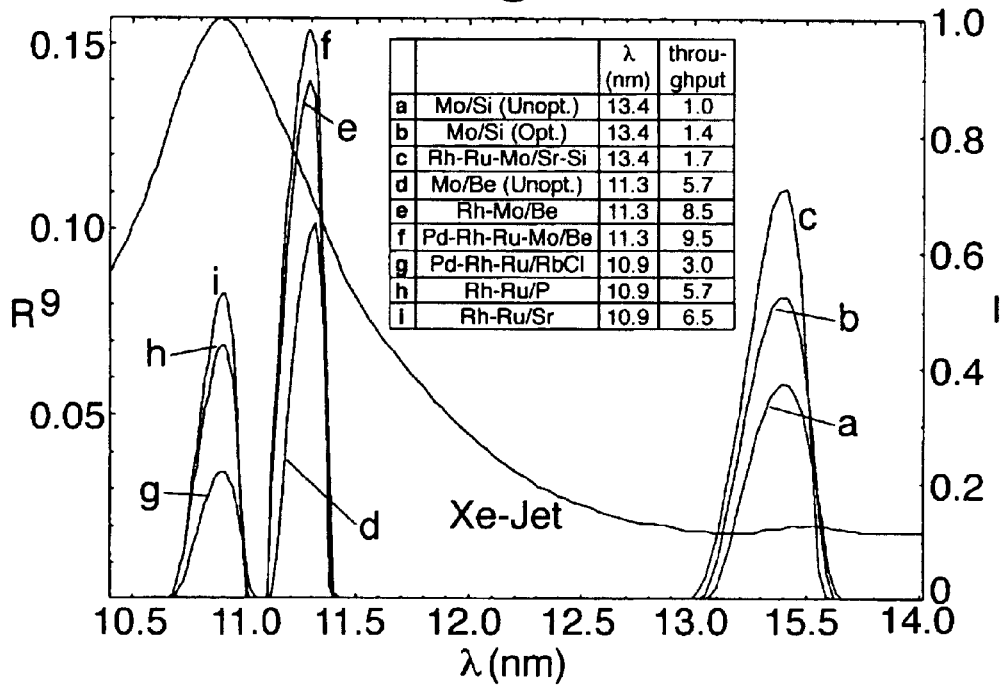
FIG. 9. Is a graph showing $R^9$ vs. wavelength for various stacks, both conventional and according to the invention as well as the emission intensity of a Xe-jet laser-induced plasma source.

FIG. 9 shows the $R^9$ reflectivities (left axis) of various reflectors and the relative Xe-Jet LPS emission intensity (right axis) vs. wavelength in nm (X axis). In FIG. 9:

(a) is the spectral response of the conventional unoptimized Mo/Si stack and is used as the reference for relative reflectivity figures.

(b) is an optimized Mo/Si stack similar to example 7 above;

(c) is an optimized Rh—Ru—Mo/Sr—Si stack;

(d) is a conventional, unoptimized, Mo/Be stack similar to comparative example 24 above;

(e) is an optimized Rh—Mo/Be stock similar to example 40 above;

(f) is an optimized Pd—Rh—Ru—Mo/Be stack;

(g) is an optimized Pd—Rh—Ru/RbCl stack forming example 41 of the invention;

(h) is an optimized Rh—Ru/P stack forming example 42 of the invention; and (i) is an optimized Rh—Ru/Sr stack forming example 43 of the invention.

Although examples 41 to 43 have lower $R^9$ peak and $R^9$int than other examples described above, they have the advantage of providing their peak reflectivity very close to the emission maximum of the Xe-Jet LPS. They are thus ideal for use with this source. Taking the throughput of the unoptimised Mo/Si stack as 1.0, examples 41(g), 42(h) and 43(i) provide relative throughputs of 3.0, 5.7, and 6.5 respectively. This also compares well with the throughput of the Mo/Be stack (d), which is 5.7 and avoids the use of Be, which is highly toxic.

Further improvements in peak reflectivity, giving values greater than 0.75 in the 9.0 to 12 nm region can be attained in four component stacks that combine P and Sr, e.g. Rh—Ru/P—Sr.

Figure 10:
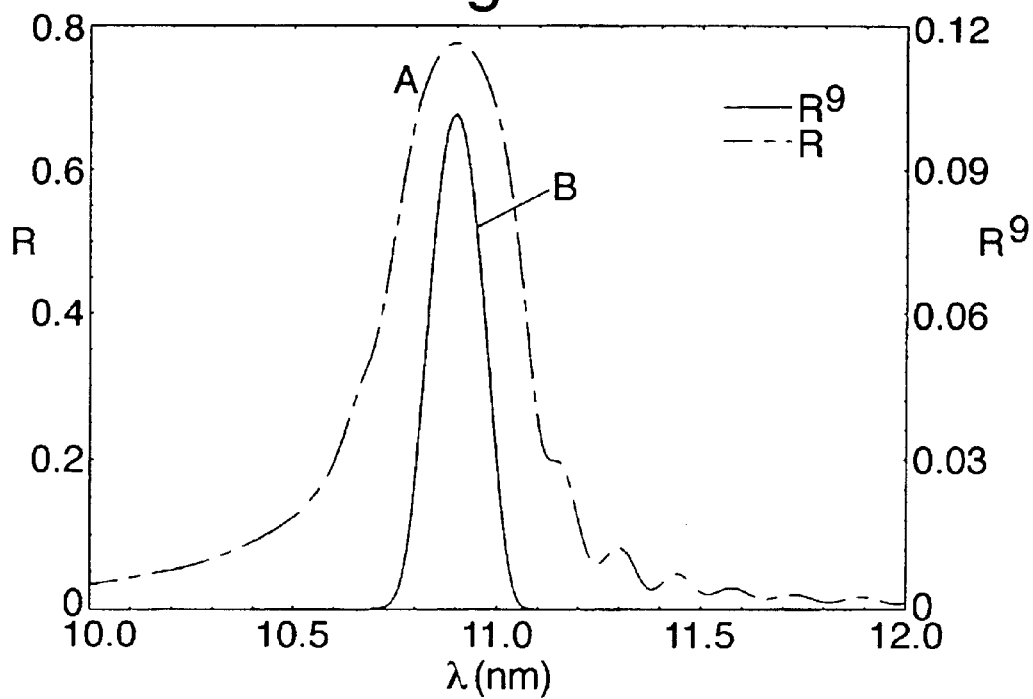
FIG. 10 is a graph showing R and $R^9$ vs. wavelength for a Rh—Ru/Sr—Ce stack according to the invention.
Figure 11:
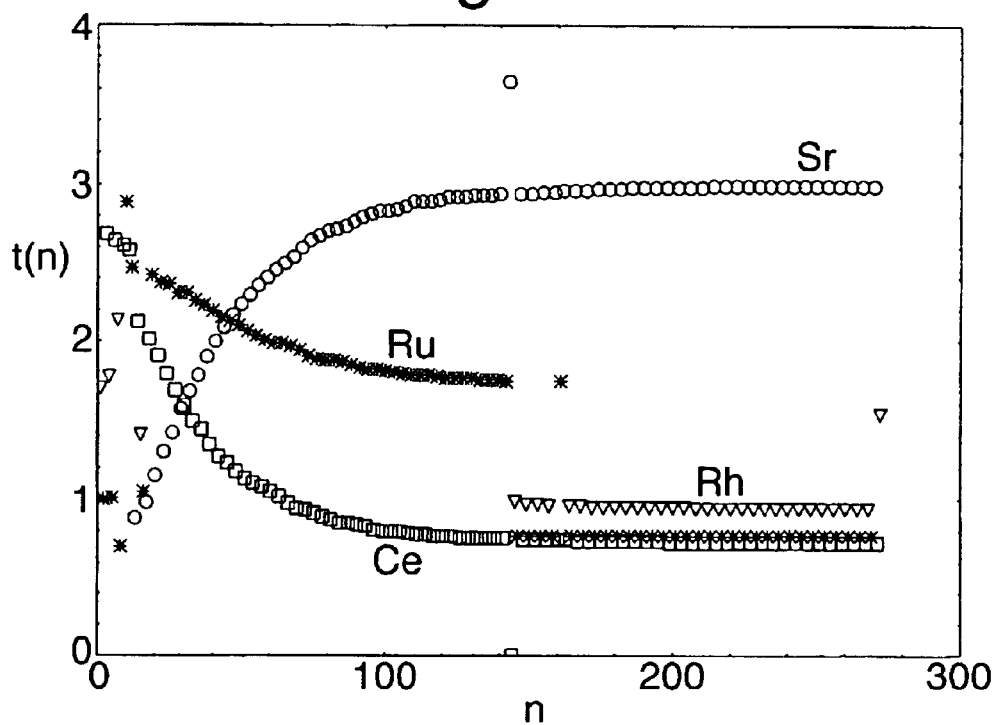
FIG. 11 is a graph of layer thicknesses in an optimised Rh—Ru/Sr—Ce stack according to the invention.

A further advance is shown by example 44. Example 44 is a needle optimized Rh—Ru/Sr—Ce stack with a peak reflectivity of R=0.776 at 10.9 nm. FIG. 10 shows the full wavelength dependence of R (left axis) and $R^9$ (right axis) of example 44 in the 10 to 12 nm range. FIG. 11 shows layer thicknesses in this stack.

EXAMPLES 45 to 48

Some further alternative stack configurations are shown in Table 4. In this table, Example 45 is a three layer stack of Ru—Nb/Si, which demonstrates that Niobium can also give improvements in an Si-based stack, but is otherwise the same as the examples 8 to 12 of Table 2.

For use at 12.8 nm, different multilayers may be optimal. Two such multilayers are example 47 and 48 of Table 4. At 46, the R value of a conventional Mo/Si (equivalent to Comparative Example 1) at 12.8 nm is given. It can readily be seen that the addition of Ru partially replacing Mo improves reflectivity at this frequency while the use of beryllium as a spacer material partially replacing silicon provides further improvements.

In general, the lanthanides (rare earth metals) may provide good optical contrast with metals such as Mo, Ru and Rh and may be preferred in reflectors nearer the substrate. In this position, optical contrast is provided because the lanthanides have a refractive index n very close to unity which outweighs the disadvantage that their values of extinction coefficient k are not as low as some other materials in the 9–16 nm region. Lanthanum is particularly preferred at or near 13 nm.

Figure 12:
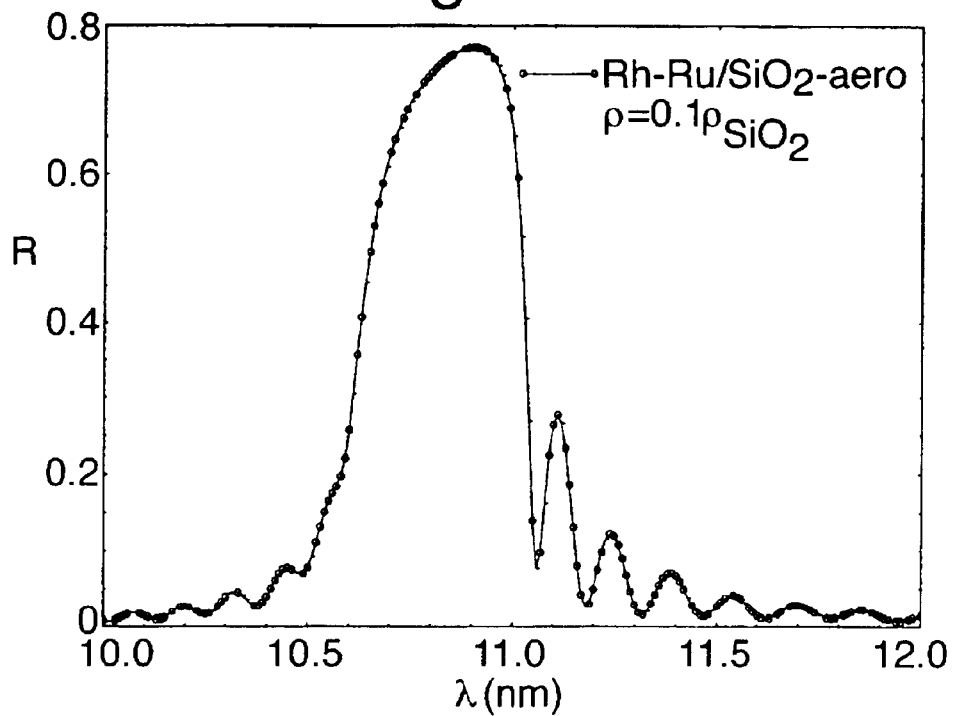
FIG. 12 is a graph showing R versus wavelength for a Rh—Ru/SiO$_2$-aero stack according to the invention.

Further alternative spacers useable in the invention are porous materials such as low density (porous) silica (aerogel) having a density about 1 tenth that of bulk silica. FIG. 12 shows the wavelength sensitivity of a Rh—Ru/$SiO_2$-aero stack using such porous silica. Its relatively broad reflectance peak below 11 nm will be noted. Other low density materials that may be used include: titania and alumina aerogels; nano-porous silicon, meso-porous silicon, nanoclusters of silicon and other semiconductors. These materials may be used to manufacture reflectors tuned to specific wavelengths throughout the 8 to 20 nm wavelength range. The materials are useful because the values on n and k are density dependent. With decreasing density the refractive index, n, tends to unity and the extinction coefficient, k, tends to zero. The density of a typical Si aerogel is 0.2 $gcm^{-3}$ whilst that of porous Si is 1.63 $gcm^{-3}$.

EXAMPLES 49 to 65

Further examples of useful capping layers are set out in Tables 5 and 6, which give the same data as previous tables.

In Table 5, 49 is a comparative example consisting of an optimized (for 13.4 nm) 50 period Mo/Si stack whose outermost layer is 2 nm of $SiO_2$ formed by natural oxidation of the final Si layer in the stack. This comparative example forms the reference for relative values of $R^9$peak and $R^9$int for Examples 50 to 57 of the invention. These examples differ from comparative example 49 only in the indicated capping layer, which is deposited on final Si layer of the stack before that layer can oxidized. It will be seen that each of palladium (Pd), boron carbide ($B_4C$), boron nitride (BN), silicon carbide (SiC), silicon nitride ($Si_3N_4$) and diamond-like carbon (dl-C) exhibit improved reflectance, or an acceptable reduction, whilst exhibiting a high degree of resistance to chamical attack.

In Table 6, 58 is a comparative example consisting of an 80 period optimized (for 11.3 nm) Mo/Be stack, similarly with an outermost layer of 2 nm BeO formed by natural oxidation of the final Be layer. This comparative example forms the reference for the relative values of $R^9$peak and $R^9$int for Examples 59 to 65 of the invention. Examples 59 to 65 differ from comparative example 58 in the indicated capping layer which is deposited before the outer Be layer can oxidized. It will again be seen that the layers specified provide improved reflectivity, or an acceptable reduction, whilst exhibiting a high degree of resistance to chemical attack.

EXAMPLES 66 to 76

Figure 13:
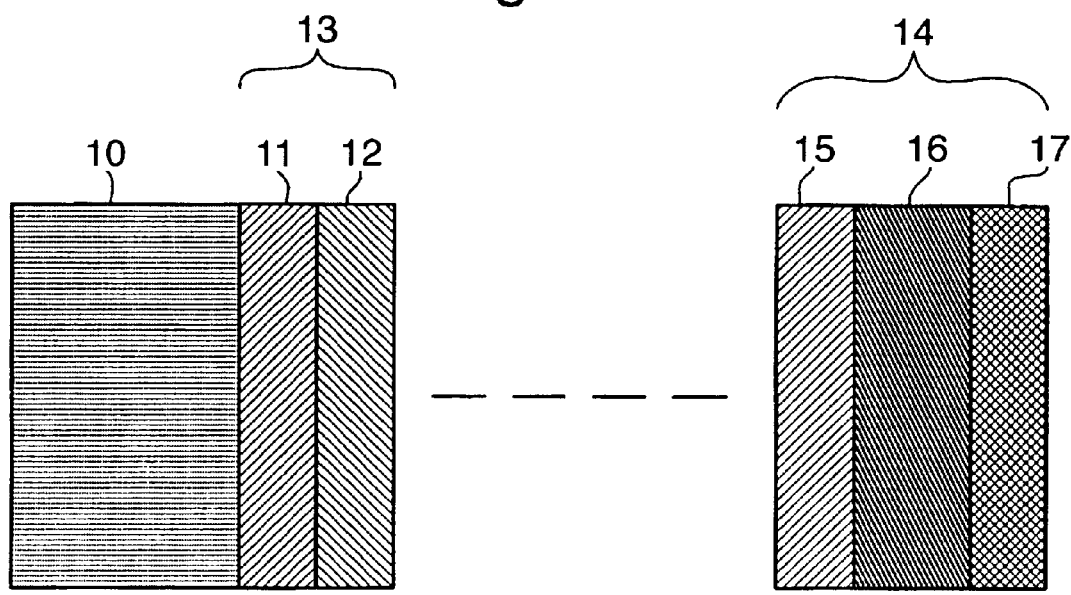
FIG. 13 is a diagram of a multilayer coating having a capping layer according to the invention.

In examples 66 to 76 the capping layer includes a modified final layer of the multilayer coating as well as a dedicated capping sublayer so as to form a bi- or tri-layer protective structure thus increasing the overall thickness of the top layers and reducing the likelihood of incomplete coverage through multiple layer deposition. This is illustrated in FIG. 13.

The reflector of examples 66 to 76 of the invention comprises substrate 10 on which are deposited N periods of alternating layers of a first material 11 and a second material 12. In FIG. 13 only the first period 13 is shown however all periods save the last are similar. The final, $N^{th}$ period comprises a layer 15 of the first material, a layer 16 of a third material and a capping sub-layer 17 of a capping material. In the following, the first material is denoted X, the second material Y and the third material Z.

The first material X is one or more of: Mo, Ru, Rh, Nb, Pd, Y and Zr, and the second material Y is one or more of: Be, Si, Sr, Rb, RbCl and P. The final period is constructed such that the substance X is chosen as previously, the third material Z on the other hand, is chosen from a set of materials with a moderately high value of refractive index n (>0.96), sufficiently low value of the extinction coefficient k (<0.01), and which are known for their chemical inertness and stability. For the 10–15 nm spectral region the following materials are suitable: $B_4C$, BN, diamond-like C, $Si_3N_4$ and SiC. Although these materials are not ideal "spacers", the reflectivity loss through absorption in layer 16 may be tolerated in favour of long-term chemical and structural integrity of the multilayer. In addition, the combination of layers 15 and 16 has a total optical thickness of ~2 quarter wavelengths (where the quarter-wave optical thickness is given by: QW=4 nd/λ), thus contributing to the reflection coefficient and avoiding a drastic reduction in the reflectivity which may be caused by relatively thick (>3 nm) capping layers. In addition the material of the capping layer 17 has low n such that a large optical contrast is maintained between layers 16 and 17. The boundary between layers 16 and 17 also serves to localise the node of the standing wave formed through the superposition of the incident and reflected waves. Suitable materials for capping layer 17 in this configuration are: Ru, Rh, Pd and diamond-like C.

Table 7 shows layer materials and thicknesses for Examples 66 to 71 which comprise 79 periods of Mo/Be plus the additional period X/Z constructed as described above. These examples are intended for use at 11.3 nm. In example 66, the whole of the Be layer is oxidized and a Ru capping layer is deposited. This is the reference example. Example 67 shows that SiC is not ideal for the 11.3 nm region. However, Examples 70 and 71 show clearly that values of R greater than 75.5% are still possible with such a configuration. Rh is used to replace the Mo layer on account of its inertness and C or $B_4C$ is deposited as layer 16 with an additional coating of Ru as layer 17. This gives a tri-layer of thickness of 7.7 nm forming the protective coating structure. Examples 68 and 69 are analogous to 70 and 71 respectively, with the important distinction that the thickness of the layer 17 is increased by 2QW resulting in lower, but still respectable, reflectivity values and with a substantially higher tri-layer thickness of 13.7 nm.

Similarly, Table 8 shows layer materials and thicknesses for Examples 72 to 76 which comprise 49 periods of Mo/Si with the additional period formed by the X/Z combination again terminated with a Ru capping layer. The reference example 72 represents a fully oxidised top Si layer upon which a Ru capping layer is applied. SiC and $B_4C$ are the most favorable materials for the Z layer 16. However, at 13.4, for which these examples are intended, Mo cannot be replaced by the more inert metal Rh, therefore a bi-layer protective structure is formed where the combined thickness of layers 16 and 17 ($d_Z+d_{CL}$) is about 5.5–6.0 nm. In example 73 the thickness of the SiC layer is increased by 2QW resulting in a 12.6 nm protective bi-layer thickness at the expense of reflectivity.

Other suitable materials for the capping layer are Au, $MgF_2$, LiF, $C2F_4$ (teflon) and TiN While we have described above specific embodiments of the invention it will be appreciated that the invention may be practiced otherwise than as described. The description is not intended to limit the invention.

TABLE 1

|  | 10.9 nm | | 11.3 nm | | 13.4 nm | |
| --- | --- | --- | --- | --- | --- | --- |
|  | n | k | n | k | n | k |
| B |  |  | 0.9786 | 0.0023 | 0.9689 | 0.0040 |
| $B_4C$ |  |  | 0.9753 | 0.0029 | 0.9643 | 0.0050 |
| Be | 1.0092 | 0.0196 | 1.0081 | 0.0010 | 0.9892 | 0.0018 |
| BeO |  |  | 0.9785 | 0.0102 | 0.9587 | 0.0171 |
| BN |  |  | 0.9740 | 0.0050 | 0.9633 | 0.0086 |
| C |  |  | 0.9732 | 0.0040 | 0.9622 | 0.0067 |
| Ce | 1.0522 | 0.0197 | 1.0380 | 0.0159 | 1.0074 | 0.0062 |
| Eu | 0.9902 | 0.0062 | 0.9883 | 0.0074 | 0.9812 | 0.0123 |
| La | 1.0777 | 0.0601 | 1.0460 | 0.0200 | 1.0050 | 0.0065 |
| Mo |  |  | 0.9514 | 0.0046 | 0.9227 | 0.0062 |
| P | 0.9949 | 0.0014 |  |  |  |  |
| Pd | 0.9277 | 0.0099 | 0.9198 | 0.0135 | 0.8780 | 0.0443 |
| Pr | 1.0167 | 0.0119 | 1.0115 | 0.0125 | 0.9840 | 0.0072 |
| Rb |  |  | 0.9974 | 0.0014 | 0.9941 | 0.0007 |
| RbCl | 0.9943 | 0.0023 | 0.9941 | 0.0022 | 0.9895 | 0.0019 |
| Rh | 0.9313 | 0.0068 | 0.9236 | 0.0089 | 0.8775 | 0.0296 |
| Ru | 0.9373 | 0.0056 | 0.9308 | 0.0063 | 0.8898 | 0.0165 |
| Si |  |  | 1.0055 | 0.0146 | 0.9999 | 0.0018 |
| Si aerogel | 0.9988 | 0.0011 |  |  |  |  |
| Porous Si | 1.0015 | 0.0049 |  |  |  |  |
| $Si_3N_4$ |  |  | 0.9864 | 0.0173 | 0.9741 | 0.0092 |
| SiC |  |  | 0.9936 | 0.0159 | 0.9831 | 0.0047 |
| $SiO_2$ |  |  | 0.9865 | 0.0123 | 0.9787 | 0.0106 |
| Sr | 0.9936 | 0.0011 | 0.9928 | 0.0011 | 0.9880 | 0.0013 |
| Y |  |  | 0.9835 | 0.0020 | 0.9742 | 0.0023 |
| Zr |  |  | 0.9733 | 0.0029 | 0.9585 | 0.0037 |

TABLE 2

|  |  |  |  |  | R | R°peak | R°int |
| --- | --- | --- | --- | --- | --- | --- | --- |
| 1 | Mo/Si |  | N | 2 nm $SiO_2$ | 0.731 | 1.00 | 1.00 |
| 2 | Mo/Si |  | N | (2 nm Si +) 2 nm $SiO_2$ | 0.741 | 1.13 | 1.07 |
| 3 | Mo/Si |  | N | 2 nm B | 0.751 | 1.27 | 1.25 |
| 4 | Mo/Si |  | Y | 2 nm B | 0.752 | 1.29 | 1.26 |
| 5 | Mo/Si |  | Y | 1.5 nm Rh | 0.754 | 1.32 | 1.27 |
| 6 | Mo/Si |  | N | 1.5 nm Ru | 0.757 | 1.37 | 1.35 |
| 7 | Mo/Si |  | Y | 1.7 nm Ru | 0.758 | 1.39 | 1.36 |
| 8 | Mo-Rh/Si |  | Y | 1.7 nm Ru | 0.762 | 1.45 | 1.38 |
| 9 | Mo-RbCl/Si |  | Y | 1.5 nm Ru | 0.761 | 1.44 | 1.39 |
| 10 | Mo-Ru/Si |  | Y | 1.5 nm Rh | 0.760 | 1.42 | 1.41 |
| 11 | Mo-Ru/Si |  | Y | 1.7 nm Ru | 0.765 | 1.51 | 1.50 |
| 12 | Mo-Ru/Si |  | Y(n) | 1.5 nm Ru | 0.764 | 1.48 | 1.59 |
| 13 | Mo-Rh-RbCl/Si |  | Y | 1.7 nm Ru | 0.764 | 1.49 | 1.38 |
| 14 | Mo-Ru-Zr/Si |  | Y | 1.7 nm Ru | 0.764 | 1.49 | 1.44 |
| 15 | Mo-Ru-Y/Si |  | Y | 1.5 nm Ru | 0.770 | 1.60 | 1.55 |
| 16 | Mo-Ru-RbCl/Si |  | Y | 1.5 nm Ru | 0.767 | 1.54 | 1.56 |
| 17 | Mo-Rh-Sr/Si |  | Y | 1.6 nm Ru | 0.779 | 1.77 | 1.56 |
| 18 | Mo-Ru-Sr/Si |  | Y | 1.5 nm Rh | 0.776 | 1.71 | 1.57 |
| 19 | Mo-Ru-Sr/Si |  | Y | 1.5 nm Ru | 0.791 | 1.81 | 1.68 |
| 20 | Mo-Ru-Sr/Si |  | Y(n) | 1.5 nm Ru | 0.781 | 1.81 | 1.85 |
| 21 | Ru/Rb |  | Y | 1.5 nm Ru | 0.779 | 1.77 | 1.41 |
| 22 | Mo/Rb |  | Y | 1.5 nm Ru | 0.809 | 2.49 | 2.13 |
| 23 | Mo-Ru-Sr/Rb |  | Y | 1.5 nm Ru | 0.814 | 2.63 | 2.20 |

TABLE 3

|  |  |  |  |  | R | R°peak | R°int |
| --- | --- | --- | --- | --- | --- | --- | --- |
| 24 | Mo/Be |  | N | 2 None | 0.775 | 1.00 | 1.00 |
| 25 | Mo/Be |  | N | 1.5 nm Rh | 0.782 | 1.08 | 1.08 |
| 26 | Mo/Be |  | Y | None | 0.780 | 1.06 | 1.00 |
| 27 | Mo/Be |  | Y | 1.5 nm Rh | 0.787 | 1.15 | 1.06 |
| 28 | Mo/Be |  | Y | 1.5 nm Ru | 0.788 | 1.16 | 1.08 |
| 29 | Ru/Be |  | Y | 1.5 nm Rh | 0.810 | 1.49 | 1.68 |
| 30 | Ru/Be |  | Y | 1.5 nm Ru | 0.811 | 1.50 | 1.70 |
| 31 | Rh/Be |  | N | 1.5 nm Rh | 0.793 | 1.10 | 1.33 |
| 32 | Rh/Be |  | Y | 1.5 nm Rh | 0.793 | 1.23 | 1.29 |
| 33 | Rh/Be |  | Y | 1.5 nm Ru | 0.794 | 1.24 | 1.31 |
| 34 | Rh/Be |  | Y(n) | 1.5 nm Rh | 0.811 | 1.50 | 1.77 |
| 35 | Mo-Sr/Be |  | Y | 1.5 nm Rh | 0.799 | 1.32 | 1.21 |
| 36 | Ru-Sr/Be |  | Y | 1.5 nm Rh | 0.822 | 1.70 | 1.97 |
| 37 | Ru-Sr/Be |  | Y | 1.5 nm Ru | 0.823 | 1.72 | 2.00 |
| 38 | Rh-Sr/Be |  | Y | 1.5 nm Rh | 0.810 | 1.49 | 1.64 |
| 39 | Rh-Sr/Be |  | Y | 1.5 nm Ru | 0.811 | 1.50 | 1.67 |
| 40 | Ru-Mo/Be |  | Y(n) | 1.5 nm Ru | 0.812 | 1.52 | 1.72 |

TABLE 4

|  |  |  |  | R | R°peak | R°int |
| --- | --- | --- | --- | --- | --- | --- |
| 45 | Ru-Nb/Si | Y | 2 nm Rh | 0.754 | 1.20 | 1.27 |
| 46 | Mo/Si | N | 2 nm Si + 2 nm $SiO_2$ | 0.738 | 1.00 | 1.00 |
| 47 | Ru-Mo/Si | Y | 2 nm Rh | 0.768 | 1.43 | 1.48 |
| 48 | Ru-Mo/Be-Si | Y | 2 nm Rh | 0.778 | 1.61 | 1.63 |

TABLE 5

|  |  |  |  | R | R°peak | R°int |
| --- | --- | --- | --- | --- | --- | --- |
| 49 | Mo/Si | Y | 2 nm $SiO_2$ | 0.745 | 1.00 | 1.00 |
| 50 | Mo/Si | Y | 2 nm Pd | 0.743 | 0.97 | 0.92 |
| 51 | Mo/Si | Y | 2 nm $Si_3N_4$ | 0.747 | 1.01 | 1.02 |
| 52 | Mo/Si | Y | 2 nm SiC | 0.748 | 1.03 | 1.04 |
| 53 | Mo/Si | Y | 2 nm BN | 0.749 | 1.04 | 1.05 |
| 54 | Mo/Si | Y | 2 nm Rh | 0.751 | 1.06 | 1.05 |
| 55 | Mo/Si | Y | 2 nm (dl-)C | 0.750 | 1.06 | 1.08 |
| 56 | Mo/Si | Y | 2 nm $B_4C$ | 0.751 | 1.07 | 1.10 |
| 57 | Mo/Si | Y | 2 nm Ru | 0.758 | 1.16 | 1.17 |

TABLE 6

|   | X/Y | Y | CL | R | R°peak | R°int |
|---|---|---|---|---|---|---|
| 58 | Mo/Be | Y | 2 nm BeO | 0.774 | 1.00 | 1.00 |
| 59 | Mo/Be | Y | 2 nm SiC | 0.769 | 0.94 | 0.92 |
| 60 | Mo/Be | Y | 2 nm BN | 0.779 | 1.06 | 1.09 |
| 61 | Mo/Be | Y | 2 nm Pd | 0.781 | 1.09 | 1.10 |
| 62 | Mo/Be | Y | 2 nm (dl-)C | 0.781 | 1.08 | 1.11 |
| 63 | Mo/Be | Y | 2 nm $B_4C$ | 0.782 | 1.09 | 1.13 |
| 64 | Mo/Be | Y | 2 nm Rh | 0.786 | 1.15 | 1.18 |
| 65 | Mo/Be | Y | 2 nm Ru | 0.788 | 1.17 | 1.21 |

TABLE 7

|   | X/Y | X | Z | CL | R | R°peak | R°int |
|---|---|---|---|---|---|---|---|
| 66 | Mo/Be | 2.05 nm (0.69 QW) Mo | 3.77 nm (1.31 QW) BeO | 2.03 nm Ru | 0.717 | 1.00 | 1.00 |
| 67 | Mo/Be | 4.12 nm (1.35 QW) Rh | 1.93 nm (0.68 QW) SiC | 2.04 nm Ru | 0.713 | 0.95 | 0.91 |
| 68 | Mo/Be | 1.70 nm (0.56 QW) Rh | 9.95 nm (3.43 QW) C | 2.03 nm Ru | 0.721 | 1.05 | 1.09 |
| 69 | Mo/Be | 1.56 nm (0.51 QW) Rh | 10.06 nm (3.47 QW) $B_4C$ | 1.96 nm Ru | 0.739 | 1.30 | 1.25 |
| 70 | Mo/Be | 1.70 nm (0.56 QW) Rh | 4.15 nm (1.43 QW) C | 1.90 nm Ru | 0.756 | 1.61 | 1.57 |
| 71 | Mo/Be | 1.56 nm (0.51 QW) Rh | 4.27 nm (1.47 QW) $B_4C$ | 1.85 nm Ru | 0.765 | 1.78 | 1.73 |

TABLE 8

|   | X/Y | X | Z | CL | R | R°peak | R°int |
|---|---|---|---|---|---|---|---|
| 72 | Mo/Si | 2.84 nm (0.78 QW) Mo | 4.24 nm (1.24 QW) $SiO_2$ | 2.05 nm Ru | 0.699 | 1.00 | 1.00 |
| 73 | Mo/Si | 3.28 nm (0.90 QW) Mo | 10.63 nm (3.12 QW) SiC | 2.06 nm Ru | 0.696 | 0.97 | 0.93 |
| 74 | Mo/Si | 3.87 nm (1.07 QW) Mo | 3.38 nm (0.97 QW) C | 1.97 nm Ru | 0.716 | 1.24 | 1.21 |
| 75 | Mo/Si | 3.23 nm (0.89 QW) Mo | 3.95 nm (1.14 QW) $B_4C$ | 1.92 nm Ru | 0.725 | 1.39 | 1.36 |
| 76 | Mo/Si | 3.28 nm (0.90 QW) Mo | 3.52 nm (1.12 QW) SiC | 1.87 nm Ru | 0.735 | 1.57 | 1.53 |

We claim:

1. A lithographic projection apparatus, comprising:

an illumination system constructed and arranged to supply a projection beam of radiation;

a first object table provided with a first object holder constructed and arranged to hold a mask;

a second object table provided with a second object holder constructed and arranged to hold a substrate;

a projection system constructed and arranged to utilize said radiation to image an irradiated portion of the mask onto a target portion of the substrate; and at least one of said illumination system and projection system having an optical element with a surface on which radiation is incident and a capping layer covering said surface, said capping layer being formed of a relatively inert material, wherein said relatively inert material is selected from the group consisting of: diamond-like carbon, Ru, Rh, TiN, $MgF_2$, LiF, $C_2F_4$ and compounds and alloys thereof.

2. Apparatus according to claim 1 wherein said relatively inert material is more inert than material from which remaining portions of said optical element are formed.

3. Apparatus according to claim 1 wherein said relatively inert material is less easily oxidized than the material from which remaining portions of said optical element are formed.

4. Apparatus according to claim 1, wherein said relatively inert material is harder than material from which remaining portions of said optical element is formed.

5. Apparatus according to claim 1 wherein said optical element is a beam modifying element.

6. Apparatus according to claim 5 wherein said optical element is a reflector having a multilayer coating on which said capping layer is provided.

7. Apparatus according to claim 1 wherein said optical element is a sensor.

8. Apparatus according to claim 1 wherein said capping layer comprises two sub-layers of different materials.

9. Apparatus according to claim 1 wherein said projection beam comprises radiation, having a wavelength in the range of from 8 nm to 20 nm.

10. Apparatus according to claim 9 wherein said projection beam comprises radiation having a wavelength in the range of from 9 nm to 16 nm.

11. Apparatus according to any one of the preceding claims wherein said capping layer has a thickness in the range of from 0.5 nm to 10 nm.

12. Apparatus according to claim 11 wherein said capping layer has a thickness in the range of from 0.5 nm to 6 nm.

13. Apparatus according to claim 12 wherein said capping layer has a thickness in the range of from 0.5 nm to 3 nm.

14. A device manufacturing method using a lithographic apparatus, the method comprising:

providing a mask containing a pattern to a first object table;

providing a substrate at least partially covered by a layer of energy-sensitive material to a second object table; and irradiating said mask and imaging irradiated portions of said pattern onto said substrate;

said irradiating comprising directing radiation onto a surface of an optical element, the surface having a capping layer formed of a relatively inert material, wherein said relatively inert material is selected from the group consisting of: diamond-like carbon, Ru, Rh, TiN, $MgF_2$, LiF, $C_2F_4$ and compounds and alloys thereof.

15. A semiconductor device manufactured in accordance with the method of claim 14.

16. A lithographic projection apparatus, comprising:

an illumination system constructed and arranged to supply a projection beam of radiation;

a first object table provided with a first object holder constructed and arranged to hold a mask;

a second object table provided with a second object holder constructed and arranged to hold a substrate;

a projection system constructed and arranged to utilize said radiation to image an irradiated portion of the mask onto a target portion of the substrate; and at least one of said illumination system and projection system having a sensor with a surface on which radiation is incident and a capping layer covering said surface, said capping layer being formed of a relatively inert material, wherein said relatively inert material is selected from the group consisting of: diamond-like carbon (C), Ru, Rh, Au, MgF$_2$, LiF, C$_2$F$_4$, TiN and compounds and alloys thereof.

17. The lithographic projection apparatus according to claim 16, wherein said relatively inert material is more inert than material from which remaining portions of said sensor are formed.

18. The lithographic projection apparatus according to claim 16, wherein said relatively inert material is less easily oxidized than the material from which remaining portions of said sensor are formed.

19. The lithographic projection apparatus according to claim 16, wherein said relatively inert material is harder than material from which remaining portions of said sensor is formed.

20. The lithographic projection apparatus according to claim 16, wherein said capping layer has a thickness in the range of from 0.5 nm to 10 nm.

21. The lithographic projection apparatus according to claim 20, wherein said capping layer has a thickness in the range of from 0.5 nm to 6 nm.

22. The lithographic projection apparatus according to claim 20, wherein said capping layer has a thickness in the range of from 0.5 nm to 3 nm.

23. The lithographic projection apparatus according to claim 16, wherein said capping layer comprises two sub-layers of different materials.

24. The lithographic projection apparatus according to claim 16, wherein said projection beam comprises radiation having a wavelength in the range of from 8 nm to 20 nm.

25. A lithographic projection apparatus, comprising:

an illumination system constructed an arranged to supply a projection beam of radiation;

a first object table provided with a first object holder constructed and arranged to hold a mask;

a second object table provided with a second object holder constructed and arranged to hold a substrate;

a projection system constructed and arranged to utilize said radiation to image an irradiated portion of the mask onto a target portion of the substrate; and at least one of said illumination system and projection system having an optical element with a surface on which radiation is incident and a capping layer covering said surface, said capping layer being formed of a relative inert material, wherein said optical element is a reflector having a multilayer reflective coating on which said capping layer is provided; and wherein said relative inert material is selected from the group consisting of: diamond-like carbon (C), boron-nitride (BN), boron carbide (B$_4$C), silicon nitride (Si$_3$N$_4$), silicon carbide (SiC), B, Pd, Ru, Rh, Au, MgF$_2$, LiF, C$_2$F$_4$, TiN and compounds and alloys thereof.

26. The lithographic projection apparatus according to claim 25, wherein said multilayer reflective coating comprises a plurality of layers of a first material having a relatively low reflective index at the wavelength of said projection beam.

27. The lithographic projection apparatus according to claim 26, wherein said multilayer reflective coating further comprises a plurality of layers of a second material having a relatively high reflective index at the wavelength and alternating with said layers of said first material.

28. The lithographic projection apparatus according to claim 25, wherein said relatively inert material is more inert than material from which remaining portions of said optical element are formed.

29. The lithographic projection apparatus according to claim 25, wherein said relatively inert material is less easily oxidized than the material from which remaining portions of said optical element are formed.

30. The lithographic projection apparatus according to claim 25, wherein said relatively inert material is harder than material from which remaining portions of said optical element is formed.

31. The lithographic projection apparatus according to claim 25, wherein said capping layer has a thickness in the range of from 0.5 nm to 10 nm.

32. The lithographic projection apparatus according to claim 31, wherein said capping layer has a thickness in the range of from 0.5 nm to 6 nm.

33. The lithographic projection apparatus according to claim 31, wherein said capping layer has a thickness in the range of from 0.5 nm to 3 nm.

34. The lithographic projection apparatus according to claim 25, wherein said projection beam comprises radiation having a wavelength in the range of from 8 nm to 20 nm.

35. A lithographic projection apparatus, comprising:

an illumination system constructed and arranged to supply a projection beam of radiation;

a first object table provided with a first object holder constructed and arranged to hold a mask;

a second object table provided with a second object holder constructed and arranged to hold a substrate;

a projection system constructed and arranged to utilize said radiation to image an irradiated portion of the mask onto a target portion of the substrate; and at least one of said illumination system and projection system having an optical element with a surface on which radiation is incident and a capping layer covering said surface, said capping layer being formed of a relatively inert material, wherein said optical element comprises:

a reflector having a multilayer reflective coating on said surface, said multilayer reflective coating comprising a plurality of layers of a first material having a relatively low refractive index at the wavelength of said projection beam;

layers of a second material having a relatively high refractive index at said wavelength and alternating with said layers of said first material; and said capping layer comprises:
- a first sub-layer of said first material;
- a second sub-layer of a third material having a refractive index at said wavelength higher than said first material and being more inert than said second material; and
- a third sub-layer formed of a fourth material that is relatively inert, said first, second and third sub-layers being provided in that order with said third sub-layer outermost.

36. The lithographic projection apparatus according to claim 35, wherein said third material has a refractive index at said wavelength greater than about 0.95 and an extinction coefficient at said wavelength less than about 0.01.

37. The lithographic projection apparatus according to claim 36, wherein said first material is one or more materials selected from the group consisting of Mo, Ru, Rh, Nb, Pd, Y and Zr, as well as compounds and alloys of these elements;

said second material is one or more materials selected from the group consisting of Be, Si, Sr, Rb, RbCl and P, as well as compounds and alloys thereof;

said third material is selected from the group consisting of $B_4C$, BN, diamond-like carbon (C), $Si_3N_4$ and SiC; and said fourth material is selected from the group consisting of Au, Ru, Rh, Pd, B, $MgF_2$, LiF, $C_2F_4$, TiN, boron nitride (BN), boron carbide ($B_4C_9$), silicon nitride ($Si_3N_4$), Silicon carbide (SiC), diamond-like carbon (C), and compounds and alloys thereof.

38. The lithographic projection apparatus according to claim 35, wherein said projection beam comprises radiation having a wavelength in the range of from 8 nm to 20nm.

* * * * *